(12) United States Patent
Headrick

(10) Patent No.: US 7,351,283 B2
(45) Date of Patent: Apr. 1, 2008

(54) SYSTEM AND METHOD FOR FABRICATING A CRYSTALLINE THIN STRUCTURE

(75) Inventor: Randall L. Headrick, Burlington, VT (US)

(73) Assignee: The University of Vermont and State Agricultural College, Burlington, VT (US)

( * ) Notice: Subject to any disclaimer, the term of this patent is extended or adjusted under 35 U.S.C. 154(b) by 181 days.

(21) Appl. No.: 11/078,544

(22) Filed: Mar. 11, 2005

(65) Prior Publication Data

US 2005/0199181 A1 Sep. 15, 2005

Related U.S. Application Data

(60) Provisional application No. 60/552,135, filed on Mar. 11, 2004.

(51) Int. Cl.
C30B 1/00 (2006.01)
C30B 3/00 (2006.01)
C30B 5/00 (2006.01)

(52) U.S. Cl. ............................. 117/60; 117/13; 117/37; 117/43; 117/49; 117/54; 117/56; 117/57; 117/59; 117/70; 117/84; 117/98; 438/82; 438/604; 438/99

(58) Field of Classification Search ................... 117/5, 117/12, 37, 43, 54, 56, 57, 68, 70, 84; 438/82, 438/604, 99
See application file for complete search history.

(56) References Cited

U.S. PATENT DOCUMENTS 6,123,769 A * 9/2000 Sanjoh ........................ 117/206

| | | | |
|---|---|---|---|
| 6,225,239 B1 * | 5/2001 | Ohno et al. | 438/780 |
| 6,809,037 B2 * | 10/2004 | Nishizawa | 438/714 |
| 6,821,811 B2 * | 11/2004 | Hirakata et al. | 438/82 |
| 6,963,080 B2 * | 11/2005 | Afzali-Ardakani et al. | 257/40 |
| 2003/0192471 A1 * | 10/2003 | Jurgensen et al. | 117/89 |

OTHER PUBLICATIONS

Formation of two-dimensional colloid crystals in liquid films under the action of capillary forces; P. A. Kralchevsky, N.D. Denkov, V.N. Paunov, O.D. Velev, I.B. Ivanov, H. Yushimura, and K. Nagayama; J. Phys. : Condens. Matter 6 (1994) A395-A402.

(Continued)

Primary Examiner—Yogendra N Gupta
Assistant Examiner—Seyed Masoud Malekzadeh
(74) Attorney, Agent, or Firm—Downs Rachlin Martin PLLC

(57) ABSTRACT

A crystalline thin structure (104, 204, 404) is grown on a surface (108, 228) of a substrate (112, 208, 400) by depositing molecules (136, 220) from a molecular precursor to a lateral growth front (144, 224) of the structure using a crystal grower (116, 200). In one embodiment, the crystal grower comprises a solution (124) containing the molecular precursor in a solvent (140). Molecules are added to the lateral growth front by moving one or both of the free surface (120, 120') of the solution and deposition surface relative to the other at a predetermined rate. In another embodiment, the crystal grower comprises a mask (212) that includes at least one opening (216). Precursor molecules are vacuum deposited via a molecular beam (236) at the growth front (228) of the crystalline thin structure (204) as one or both of the opening and surface are moved relative to the other at a predetermined rate.

13 Claims, 5 Drawing Sheets

OTHER PUBLICATIONS

Mechanism of Formation of Two-Dimensional Crystals from Latex Particles on Subtrates; N.D. Denkov, O.D. Velev, P.A. Kralchevsky, I.B. Ivanov, H. Yoshimura and K. Nagayama; *American Chemical Society; Langmuir* 1992, 8, 3183-3190.

Yurii A. Vlasov, Xiang-Zheng Bo, James C. Sturm and David J. Norris, "On-Chip Natural Assembly of Silicon Photonic Bandgap Crystals, "NATURE, vol.: 414, Nov. 15, 2001; Macmillan Magazines Ltd., pp. 289-293.

* cited by examiner

SYSTEM AND METHOD FOR FABRICATING A CRYSTALLINE THIN STRUCTURE

RELATED APPLICATION DATA

This application claims the benefit of priority of U.S. Provisional Patent Application Ser. No. 60/552,135, filed Mar. 11, 2004, and titled "Method for Fabricating Thin Film and Thin Wire-Like Structures," that is incorporated by reference herein in its entirety.

STATEMENT REGARDING FEDERALLY SPONSORED RESEARCH OR DEVELOPMENT

This invention was made with Government support under Grant No. EPS0236976 awarded by the National Science Foundation. The Government may have certain rights in this invention.

FIELD OF THE INVENTION

The present invention generally relates to the field of fabrication. In particular, the present invention is directed to a system and method for fabricating a crystalline thin structure.

BACKGROUND OF THE INVENTION

Virtually every large electronics company is presently engaged in research in the area of organic electronics. Specific applications include organic thin film transistors (OTFTs) and organic light-emitting devices (OLEDs). Some close to the electronics industry predict that organic microelectronics will displace inorganic microelectronics in the realm of computer and other displays, particularly flat panel displays. The reason cited for this change is that organic microelectronics can utilize flexible and lightweight material, whereas conventional flat panel displays, e.g., liquid crystal displays (LCDs) and plasma displays, typically require relatively heavy and rigid substrates and other components.

Current issues that need to be addressed for widespread commercialization of organic electronics include: (1) low-cost methods to produce thin film materials and (2) methods to produce high-quality materials composed of large crystalline domains. For example, conventional methods of depositing organic semiconductor thin films routinely produce materials that have crystalline domain sizes smaller than 10 microns. Consequently, it would be desirable for many reasons for manufacturers to be able to make high-quality organic films having crystalline domains several orders of magnitude larger than conventionally practicable and even more desirable if manufacturers were able to achieve such large crystalline domain sizes at a low cost.

SUMMARY OF THE INVENTION

In one aspect, the present invention is directed to a method of growing a crystalline thin structure. The method comprises the steps of providing a substrate having a surface and adding molecules to a lateral growth front substantially individually so as to grow a crystalline thin structure upon the surface in a direction along the surface.

In another aspect, the present invention is directed to a device. The device comprises a substrate having a non-crystalline surface. A crystalline thin structure is grown on the non-crystalline surface and has a thickness less than about 5 µm and a grain size of at least about 0.7 cm×0.7 cm.

In a further aspect, the present invention is directed to a system for growing on a surface a crystalline thin structure having a lateral growth front and made of a material. The system comprises a molecular precursor comprising molecules of the material and a crystal grower operatively configured to controllably add the molecules to the lateral growth front of the crystalline thin structure so as to grow the crystalline thin structure in a direction along the surface.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE DRAWINGS

Figure 1A:
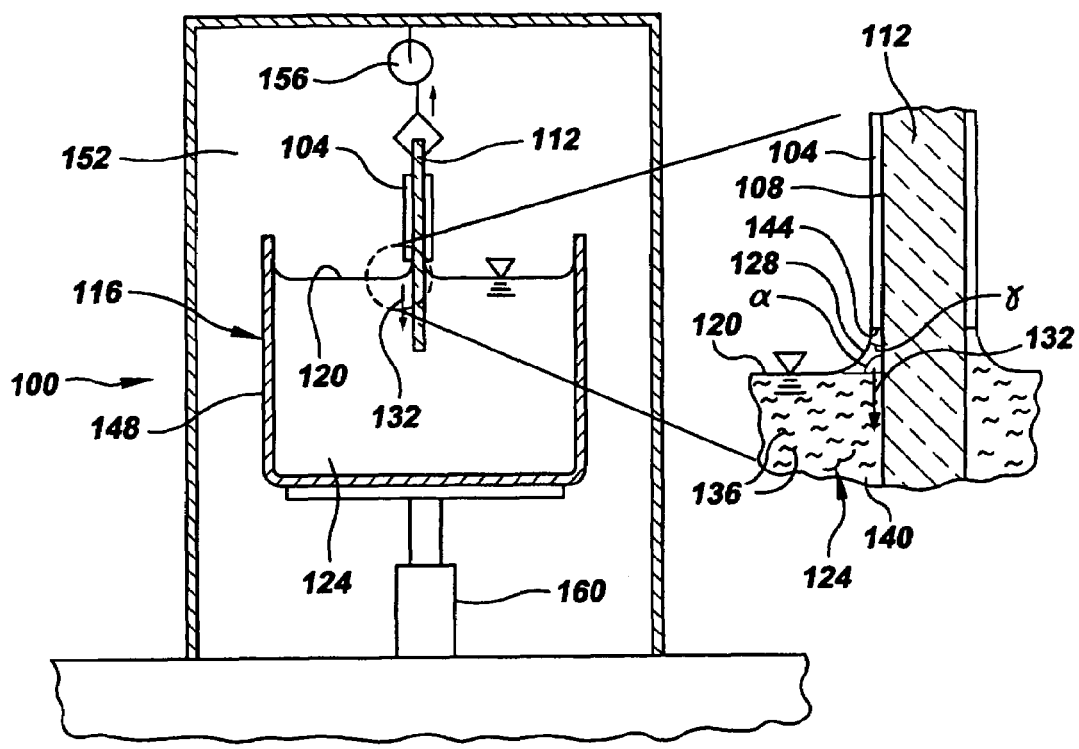
FIG. 1A is a cross-sectional elevational view of a crystalline thin structure depositing (CTSD) system of the present invention.

Referring now to the drawings, FIG. 1A shows in accordance with the present invention a crystalline thin structure depositing (CTSD) system, which is generally indicated by the numeral 100. As will become apparent from reading the following disclosure, the word "structure" as used herein and in the appended claims encompasses the various structures, e.g., structure 104, deposited using a CTSD method of the present invention. Such structures include films, dendritic structures, elongate "wire-like" structures, lattice structures and films with single-molecule thickness, among others. It is further noted from the outset that the crystalline growth of the present invention is conducted at a molecular scale, as distinct from prior art crystalline growth that has been performed at the much larger scale of synthetic microspheres, as has been reported for micron-sized silica spheres from a colloidal suspension.

A CTSD system of the present invention, such as CTSD system 100, may be used to deposit crystalline thin structures, such as structure 104, on a deposition surface 108 of a substrate 112 at a thickness of one molecule of the deposited material (e.g., about 2 nm for Anthracene) to about 5 μm, in a direction perpendicular to the deposition surface. A more typical range of thicknesses is one molecule up to about 1 μm. For example, a CTSD system of the present invention may be used to grow organic crystalline thin structures on many different surfaces, regardless of whether or not the corresponding substrate is crystalline, polycrystalline or non-crystalline, i.e., amorphous. Such structures are generally important, e.g., in the field of organic electronics because charge conduction in organic materials typically requires very high electric fields (e.g., $10^4$ V/cm to $10^6$ V/cm). Therefore, in order to operate at relatively low voltages, the organic structures must be very thin. Consequently, the present invention is particularly suited to the field of organic electronics. That said, those skilled in the art will readily appreciate that the present invention is by no means limited to the field of organic electronics.

In general, CTSD system 100 of FIG. 1A comprises a crystal grower 116 that is configured to perform one particular type of CTSD method of the present invention. In general terms, this type of CTSD method involves moving one, the other, or both of deposition surface 108 of substrate 112 and the free surface 120 of a precursor solution 124 relative to the other so that the upper edge of the meniscus 128 at the substrate traces a trajectory 132 along the deposition surface. As those skilled in the art will appreciate, in order to satisfy this trajectory requirement when deposition surface 108 is planar, the angle α formed between the deposition surface and free surface 120 of solution 124 may generally be any angle greater than 0° and less than 180°, with angles close to, and at, 90° being more typical. A number of ways to cause the upper edge of meniscus 128 to trace trajectory 132 are discussed below.

Precursor solution 124 generally comprises molecules 136 of the material of crystalline thin structure 104 dissolved in a suitable solvent 140. As the upper edge of meniscus 128 traces trajectory 132, crystalline thin structure 104 grows along a lateral growth front 144 as dissolved molecules 136 from solution 124 continually condense into solid form at the lateral growth front immediately adjacent the upper edge of the meniscus. Generally, molecules 136 are added to growth front 144 substantially individually, i.e., singly or in groups of 10 or fewer molecules, as distinguished, e.g., from conventional growth of crystals from silica microspheres, in which each microsphere contains hundreds of thousands of molecules.

Briefly, growth generally occurs when solvent 140 in solution 124 evaporates and free surface 120 of the solution is otherwise moved relative to deposition surface 108 and solution flows into the region of meniscus 128 in order to maintain the shape of the meniscus. Dissolved molecules 136 are carried along and concentrate in that region. As free surface 120 lowers and/or substrate 112 is withdrawn, either by evaporation or by external control, the dissolved molecules 136 condense into a solid. The so-far deposited crystalline thin structure 104 subsequently "seeds" growth on lateral growth front 144 at the subsequent position of meniscus 128, and the method continues, ultimately coating the entire wetted portion of deposition surface 108 with a substantially uniform crystalline layer. The rate at which structure 104 is deposited, or grown, shall be referred to hereinafter as "deposition rate." In general, the deposition rate may be precisely controlled and is a function of the speed at which free surface 120 and deposition surface 108 move relative to one another.

Growing crystalline thin structures of organic semiconductor materials have been the primary focus of the present invention because they are of significant current interest. Materials that may be deposited using the present invention include crystalline forms of Anthracene, Tetracene and Pentacene. However, those skilled in the art will readily appreciate that the present invention can be used to deposit a wide variety of materials. Examples of other materials that may be deposited to form a crystalline thin structure, such as structure 104, include, but are not limited to, derivatives of Pentacene, Anthracene and Tetracene formed by organic synthesis, poly (3-hexylthiophene) and poly(2,5-thienylene vinylene), among many others.

Solution 124 may be formulated by mixing an appropriate amount of precursor molecular solute, i.e., molecules 136 of the material to be deposited, such as molecules Anthracene, Tetracene and Pentacene, etc., with an appropriate amount of a suitable solvent 140, e.g., ethyl acetate, toluene and chlorinated solvents, among many others. Those skilled in the art will readily understand that due to the wide variety of precursor molecular solutes and solvents that may be used in connection with the present invention it is impractical, and not necessary, to provide exhaustive lists of all such components in order for those skilled in the art to practice the present invention to its fullest scope. In general, the concentration of precursor molecular solute, i.e., molecules 136, may be any value between 0% and 100% suitable for achieving the desired deposition rates and type of structure(s) 104 desired. Concentrations for a few precursor molecular solutes that have been investigated so far are discussed below. Those skilled in the art will readily appreciate that the concentrations discussed below are not limiting, but rather are merely exemplary.

Solution 124 may be contained within virtually any container 148 suitable for holding this solution. As will be readily appreciated by those skilled in the art, there are numerous ways to effect the relative movement of free surface 120 of solution and substrate 112. For example, substrate 112 may be fixed relative to container 148 and free surface 120 lowered by natural evaporation of solvent 140 within solution 124 into an uncontrolled ambient environment (not shown). In alternative embodiments, the evaporation of solvent 140 may be controlled by suitably controlling one or more aspects of a closed environment 152 to which free surface 120 is exposed and/or controlling one or more aspects of solution 124 itself. For example, the temperature, pressure and gas/vapor composition within closed environment 152 may be controlled, as may be the temperature of solution 124, among other things, so as to control the evaporation of solvent 140.

In addition, or alternatively, to controlling closed environment 152 and/or the temperature of solution 124, one or both of substrate 112 and container 148 may be supported by a corresponding respective actuator 156, 160 that moves the respective component relative to the other. Each actuator 156, 160 may be any suitable type of actuator, such as an electrical, mechanical, pneumatic or hydraulic type, or any combination of these. Those skilled in the art will readily understand how to select an appropriate actuator 156, 160 based on the speed and precision needed for a particular design.

Figure 1B:
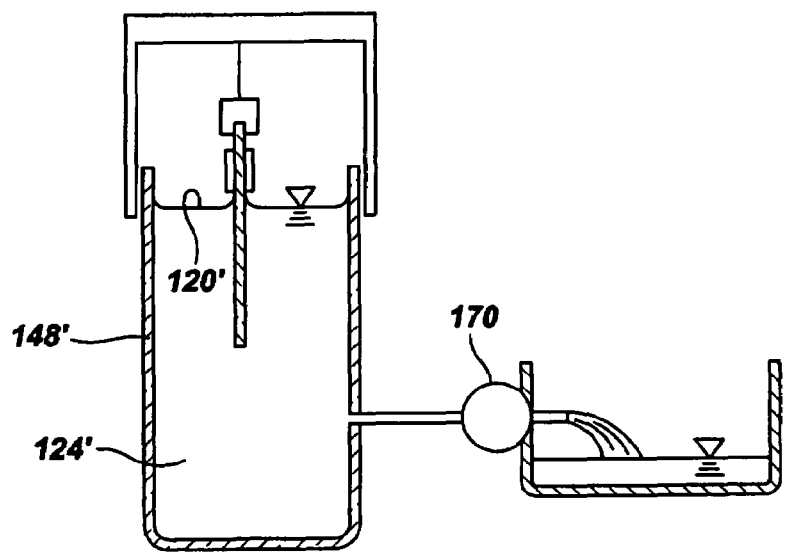
FIG. 1B is a cross-sectional elevational view of an alternative CTSD system of the present invention utilizing a solution drawdown pump for lowering the free surface of the solution during crystal growth.
Figure 1C:
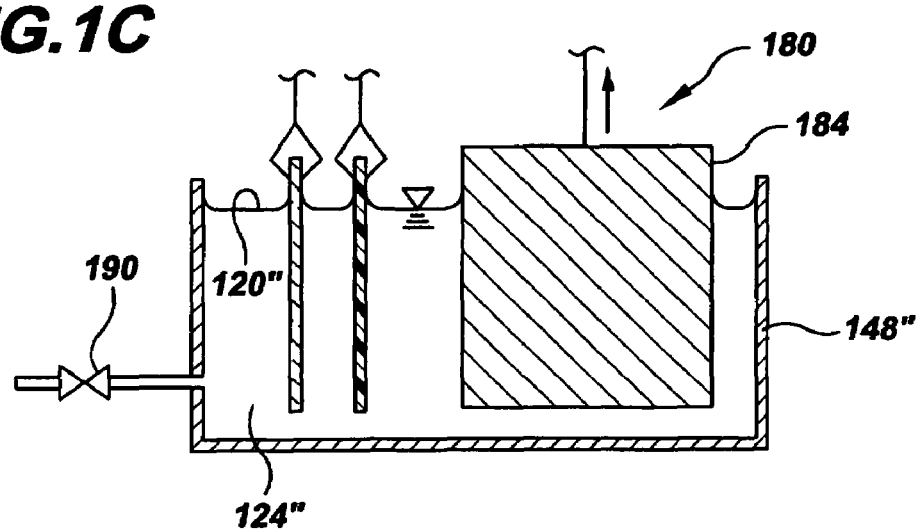
FIG. 1C is a cross-sectional elevational view of another alternative CTSD system of the present invention utilizing a solution displacing system for lowering the free surface of the solution during crystal growth.

Examples of other ways in which free surface 120 of solvent 124 and/or substrate 112 may be moved relative to the other include utilizing a drawdown pump 170 (FIG. 1B) to controllably pump solution 124' from container 148' at a desired rate so as to lower the free surface 120' within the container, utilizing a solution displacement system 180 (FIG. 1C) in which a displacer 184 is controllably withdrawn from the solution 124" so as to cause free surface 120" to lower within container 148", utilizing a valve 190 (FIG. 1C) to controllably release the solution from the container so as to lower the free surface and utilizing a variable volume container (not shown), e.g., one in which a bottom or sidewall moves relative to the others, in which the volume can be increased so as to cause the free surface to lower, among others. Of course, any two or more of these and the other ways of causing relative movement between free surface 120 (FIG. 1A) and substrate 112 may be used in concert with one another to achieve the desired deposition rate.

Referring again to FIG. 1A, substrate 112 may be made of virtually any material or combination of materials. For example, substrate 112 may be monolithic and may be, e.g., glass, polymeric or metal, among many others. Substrate 112 may alternatively be made of two or more materials, e.g., a different material for each of a plurality of layers. For example, one layer may be of one broad class of materials, e.g., polymer, conductive, etc., while the other may be of another class, e.g., metal, non-conductive, etc. In one particular example discussed below, substrate 112 includes a silicon layer having an oxided and hydrogen terminated surface layer (not shown). Again, substrate 112 need not be crystalline in nature, but rather may be amorphous.

A number of additions/modifications to a CTSD method of the present invention may be made. For example, in some applications it may be desirable to intentionally modify the wettability of deposition surface 108 so as to improve the growth of structure 104 thereon. In general, wettability determines the contact angle γ of meniscus 128. Variation of contact angle γ may, in turn, modify the thickness and/or uniformity of the resulting thin structure 104. This can be achieved, e.g., by use of a surfactant, or by treating deposition surface 108 with a self-assembled monolayer, or other coating. In the case of silicon dioxide, the wettability is improved using a base treatment that modifies the chemical termination of the silicon dioxide structure.

Figure 2:
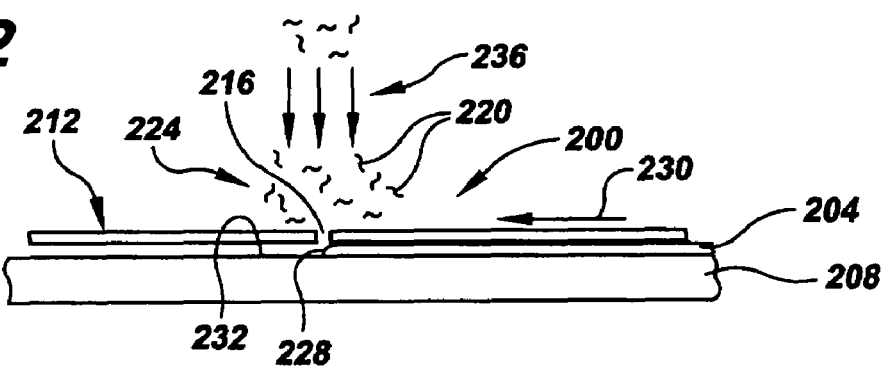
FIG. 2 is a cross-sectional view of an alternative CTSD system of the present invention that utilizes a lateral growth front mask.

Referring to FIG. 2, another modification of a CTSD method of the present invention involves utilizing an alternative type of lateral-growth crystal grower 200 to vacuum deposit a crystalline thin structure 204 on a substrate 208. In this embodiment, crystal grower 200 comprises a mask 212 having at least one opening, e.g., slit 216, through which molecules 220 from a molecular precursor 224 are deposited at the growth front 228 through the opening while the opening and/or substrate are moved relative to the other at a controlled rate, e.g., 10 cm/hr or less. For example, mask 212 may be moved in direction 230, while substrate 208 remains fixed. Mask 212 masks the deposition surface 232 and already deposited crystalline thin structure 204 except at slit 216, which is generally used to define moving growth front 228. Molecular precursor 224 may be in the form of a directed molecular beam 236 produced in vacuum. Characteristics of molecular beam 236 are typically no different from a conventional molecular beam. The size of the molecular beam source (not shown) and the distance between slit 216 and substrate 208 should be adjusted so that the slit forms a sharp shadow of the incident molecular beam 236 on substrate 208. The penumbra of the shadow should be no larger than about 1 µm, so that for a source-to-substrate distance of 500 mm, and a source size of 1 mm, slit 216 should be placed within 0.5 mm of the substrate. In this modification, the basic growth mechanism of the method is still the same as with crystal grower of FIG. 1A, i.e. lateral seeding of a growing crystallite. However, this modified CTSD method of the present invention eliminates the need for a solvent and, consequently, may be considered a more versatile method.

As mentioned above and referring to FIG. 3, organic microelectronics, such as organic microelectronic elements 300, 304, have potential applications in a number of low-cost electronic devices, such as device 308. Device 308 may be virtually any microelectronics-based device, such as a flat panel display, memory or microprocessor, among many others. It is envisioned that device 308 will typically be based on organic thin film transistors (OTFTs) (not shown) and other organic-based microelectronic components. A CTSD system of the present invention, e.g., any one of the CTSD systems of FIGS. 1A-1C and 2, may be used to make organic microelectronic elements 300, 304. Once an initial crystalline thin structure, e.g., film, has been deposited in accordance with the present invention, one or more subsequent layers, e.g., epitaxial or amorphous layers, may be deposited upon the initial layer to complete the microelectronic components and corresponding microelectronic elements 300, 304. Growth of a hetero-epitaxial layer is illustrated below. Additional detail regarding device 308 and microelectronic elements is not necessary, since those skilled in the art will understand how to build such items and understand the role of the present invention in making these items.

Among the various materials suitable for OTFTs and microelectronic elements 300, 304 in general, Pentacene stands out as a model molecule, since it has the largest field effect mobility reported so far. This has motivated a number of studies of organic semiconductor growth on dielectrics, as well as other substrates. Recently, significant progress has been made towards fabricating high quality, large-grain, polycrystalline films of Pentacene.

EXAMPLES

As discussed below, excellent results have been obtained using a CTSD method of the present invention to deposit Anthracene structures on a variety of substrates, including glass substrates, oxidized silicon substrates and polymer substrates. As mentioned above, by controlling method parameters, a variety of deposited structure morphologies may be formed, including continuous films and separated wire-like structures with individual widths as small as a few microns. Single-crystal domains have approached the length of the sample in one direction, up to 75 mm in experiments to date. A practical advantage of a CTSD method of the present invention is the ability to cover relatively large areas easily without resorting to a vacuum environment. To date, crystalline thin structures having a domain size of about 0.7 cm×0.7 cm have been grown using a CTSD method of the present invention. It is expected that larger and larger domain sizes will be achieved with further refining of deposition parameters.

Anthracene ($C_{14}H_{10}$) has a monoclinic structure with lattice constants a=8.561 Å, b=6.036 Å, c=11.163 Å and β=124° 42'. The structure is composed of layers of molecules stacked along the c-direction with "herringbone" packing within each layer. The (001) surface has the lowest free energy and, as a result, when a thin film of Anthracene is formed the a and b lattice vectors are typically in the plane of the film. Individual molecules in the film stand nearly upright with respect to the surface, but "lean over" by an angle $\chi=\beta-90°=34.6°$ from the surface normal.

Referring to FIG. 1A, in one set of experiments, several Anthracene structures (in this case films) were deposited from a 50% saturated solution 124 of Anthracene (i.e., precursor molecular solute, or molecules 136) in ethyl acetate (i.e., solvent 140). Two variations of a CTSD method of the present invention were used. In the first variation, 75 mm by 25 mm samples of glass and silicon substrates (112) were placed upright in a staining jar, i.e., container 148, containing solution 124. Each staining jar held four samples upright simultaneously. Solution 124 was allowed to evaporate over a period of 8 hours to 12 hours. In the second variation, a 600 mL beaker was used as container 148, and an oxidized silicon substrate 112 was suspended upright using a fixture to hold the sample from its upper end. A peristaltic pump (see, e.g., pump 170 of FIG. 1B) (model no. RP-1 available from Rainin Instrument Co. Inc., Emeryville, Calif.) was used to gradually remove solution from the beaker so as to lower the free surface of the solution relative to the silicon substrate at a controlled deposition rate. Several experiments were conducted at a controlled deposition rate ranging between about 1 cm/hr and about 5 cm/hr. All samples were subsequently examined with an optical microscope using fluorescence microscopy and polarized-light microscopy, with illumination from a mercury lamp. Selected samples were examined with x-ray diffraction.

Figure 4:
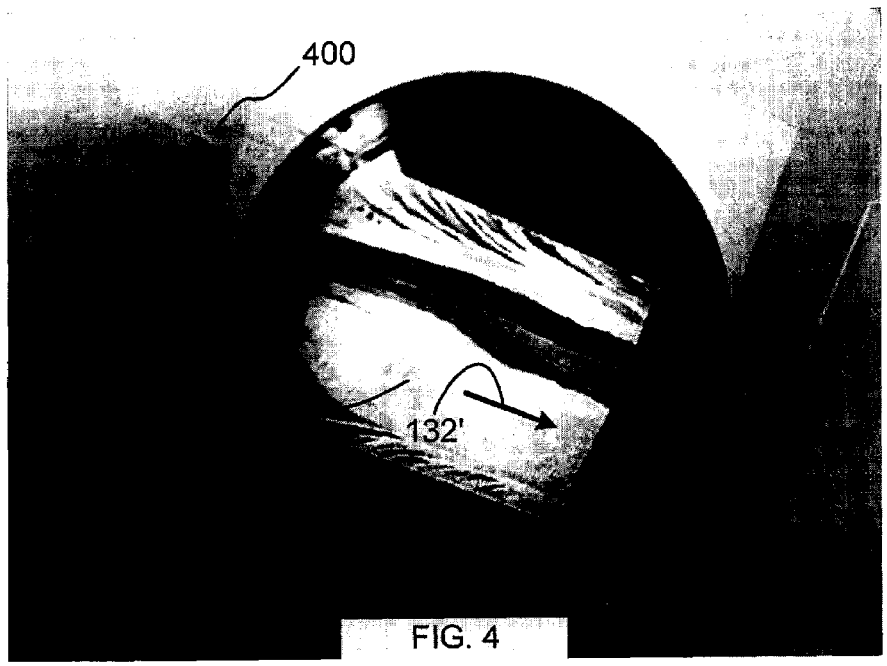
FIG. 4 is a photograph of an Anthracene film of the present invention deposited on a glass slide, the film has a domain size greater than 1 cm by 1 cm.

Referring to FIG. 4, and also to FIG. 1A for components of the CTSD system not shown in FIG. 4, in a particular example of the first variation of the CTSD method mentioned above a glass microscope slide 400 (corresponding to substrate 112) was placed vertically in a staining jar (container 148) containing a solution (solution 124) of Anthracene (molecules 136) and ethylene acetate (solvent 140). As the solution slowly evaporated, the meniscus of the solution moved across the surface (deposition surface 108) of slide 400 toward the lower edge of the slide and depositing a thin film 404 (corresponding to crystalline thin structure 104) of Anthracene on the surface of the slide. Anthracene film 404 produced was colorless and virtually perfectly transparent. For the photograph of FIG. 4, the image of Anthracene film 404 was captured through crossed polarizers with illumination from behind the film. Anthracene film 404 induced a large rotation of the polarization, thereby inducing the contrast. As a result, a clear pattern of domains in Anthracene film 404 became visible that were not readily apparent under normal viewing and illumination conditions.

As mentioned above, the concentration of the solution utilized, e.g., solution of FIG. 1A, can be controlled for a number of reasons. In addition to affecting the type of structure deposited, e.g., film versus dentritic structure, control over the thickness and morphology of films can be achieved by varying the concentration of the solution. In addition, draining or pumping away the solution, varying the level of free surface and/or moving one or the other or both of substrate and container at a controlled deposition rate can also achieve direct control over the in-plane growth rate.

Figure 5:
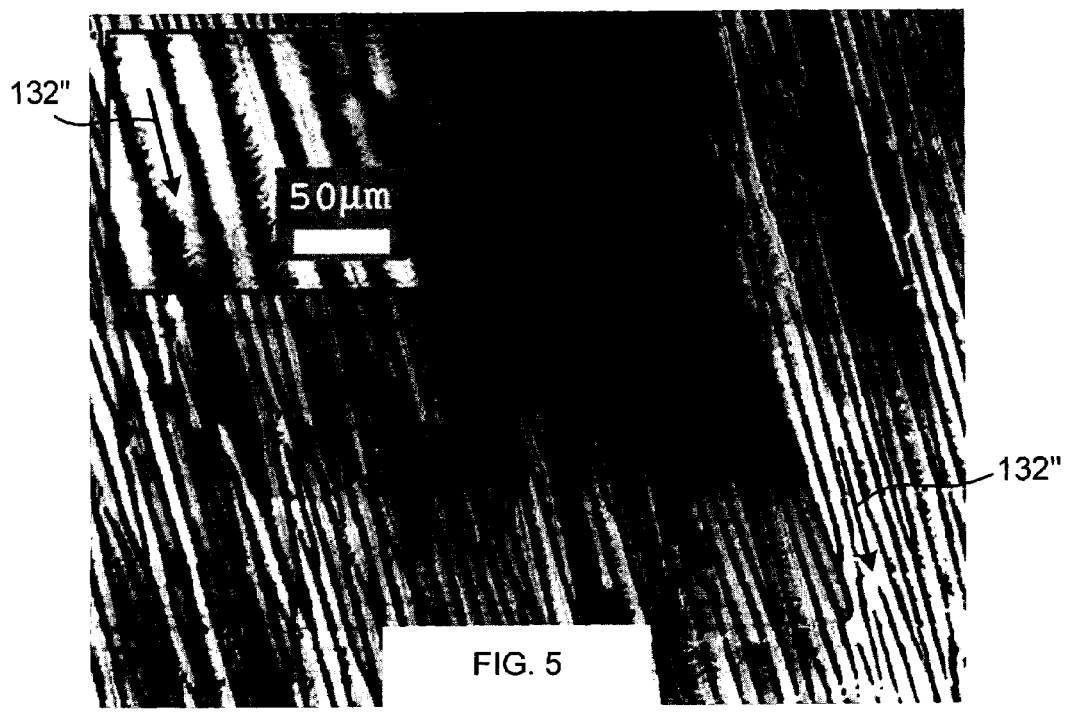
FIG. 5 is a fluorescence micrograph and an inset polarized light microscopy photograph showing an Anthracine film of the present invention deposited at approximately 5 cm/hr.

In connection with Anthracene, actively controlling the deposition rate in any one of these ways has typically produced films with submicron thickness for in-plane growth rates larger than 1 cm/hr. It is noted that in general this method does not provide direct control of the thickness of the film deposited, although the general trend for Anthracene is towards thinner films for higher deposition rates. It is also noted that Anthracene films become discontinuous for higher in-plane growth rates. For example, FIG. 5 shows a fluorescence micrograph of an Anthracene film deposited onto an oxidized silicon substrate at about 5 cm/hr. The light areas are Anthracene and the dark areas are the surface of the silicon substrate onto which the Anthracene was deposited. The image shows that an unexpected two-dimensional dendritic structure is formed. Additional imaging (inset) by polarized light microscopy showed that the crystallographic orientation is the same over the entire area shown (1 mm×1.25 mm).

The apparent mechanism that forces the selection of the highly oriented domains shown in FIGS. 4 and 5 is rather interesting. Small nuclei form early in the process and become elongated as the solution traces trajectory 132, 132', 132" (FIGS. 1A, 4 and 5, respectively) along the surface of the substrate. A preferred crystallographic direction is selected, since crystallites grow faster in certain low-index growth directions. Slow-growing nuclei with unfavorable orientations are left behind as the process proceeds, and the fast-growing domains increase rapidly in width, eventually squeezing out less favored orientations. The end result is the domain structure shown in FIG. 4, wherein single-crystal domains stretch almost the entire length of the surface in the growth direction, and, for Anthracene, have exceeded one centimeter in the direction transverse to trajectory. For Anthracene, adjacent domains have similar orientations, lying within a range of approximately ±10°.

Anthracene films can also be used as a substrate for overgrowth of other layers, e.g., epitaxial layers. For example, an Anthracene/Pentacene system is an excellent model system for investigating the possibility of highly oriented heteroepitaxy because of the chemical and structural similarities of the two chemicals. Initial results for overgrowth of Pentacene are reported herein.

The lattice constants of Pentacene are similar to the lattice constants of Anthracene, except that the value of c is significantly larger for Pentacene. This is primarily a result of the fact that the Pentacene molecule is longer than the Anthracene molecule. In the present experiments, the phase of Pentacene at issue is the so-called "thin-film" phase, which is polymorphic. The present investigators' own recent determination of the lattice parameters for this polymorph, which differ only slightly from other published values, are: $a=7.58$ Å, $b=5.91$ Å, $c=15.42$ Å, and $\gamma=90±0.2°$. In the course of collecting the data of these experiments, the present investigators have also deduced that $\beta \approx 95°$ for the Pentacene thin film phase. In both Pentacene and Anthracene, each layer of the corresponding crystal packs into a similar herringbone structure with two molecules per unit cell, and, therefore, the in-plane lattice constants are similar. Since the natural growth direction during vapor phase growth is normal to the a-b plane, the lattice mismatch in the c-direction does not affect the lattice matching at the hetero-interface between Anthracene and Pentacene.

Figure 6:
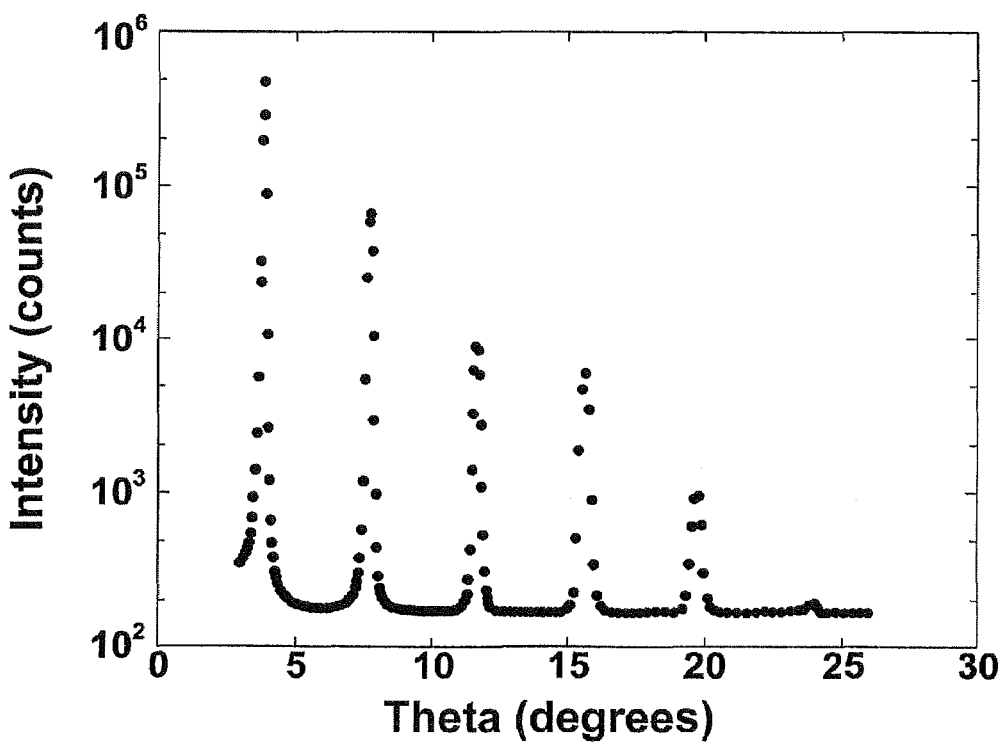
FIG. 6 is a plot of an x-ray diffraction θ-2θ scan of the film of FIG. 5.

FIG. 6 shows the results of an x-ray diffraction $\theta$-$2\theta$ scan of the sample shown in FIG. 5. Six orders of (001) reflections are clearly observed, indicating that the film is of good quality with the c* reciprocal lattice axis oriented normal to the surface. A layer spacing of $d=9.18$ Å was derived from this scan, which is consistent with the known crystal structure of bulk Anthracene. A small piece of this sample was mounted in a custom-built evaporation chamber coupled to an x-ray diffractometer for Pentacene evaporation.

Figure 7:
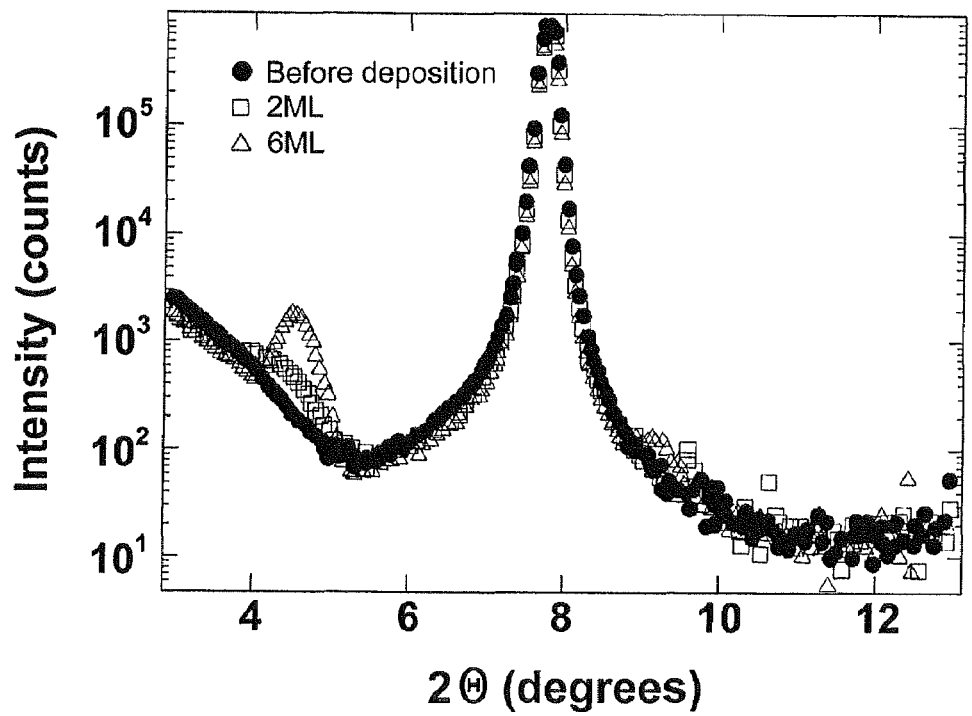
FIG. 7 is a plot of an x-ray diffraction scan performed in situ during epitaxial deposition of Pentacene on the film of FIG. 5.

Pentacene films were prepared in a custom-built vacuum evaporator, which was mounted in a four-circle x-ray diffractometer at the A2 station of the Cornell High Energy Synchrotron Source (CHESS). Substrates consisted of (100) p-type silicon wafers with a native oxide and an Anthracene film, prepared using the second variation of a CTSD method of the present invention as described above. Pentacene was evaporated from a tantalum boat under vacuum of $10^{-6}$ Torr and a substrate temperature of $-15°$ C. The rate of deposition was 0.1 nm/min to 0.5 nm/min, as measured by a quartz crystal microbalance (QCM). The QCM was calibrated using AFM measurements in sub-ML thick films. Film growth was monitored during deposition at CHESS by using 10.0 keV x-rays ($\lambda$=1.239 Å) with a flux of approximately $10^{13}$ photons/sec, incident to the sample through a Be window. X-ray measurements were performed in-situ without breaking vacuum. A scintillation counter was used for measuring the scattered x-ray intensity. X-ray diffraction scans performed in-situ during the deposition of Pentacene are shown in FIG. 7. The Pentacene (001) and (002) reflections gradually sharpen and increase in intensity, in the characteristic of laminar growth. The positions of the reflections correspond to a layer spacing of d=15.4 Å, in good agreement with the established value for the "thin film" phase of Pentacene. Growth of Pentacene was stopped at approximately 6 monolayers.

Figure 8:
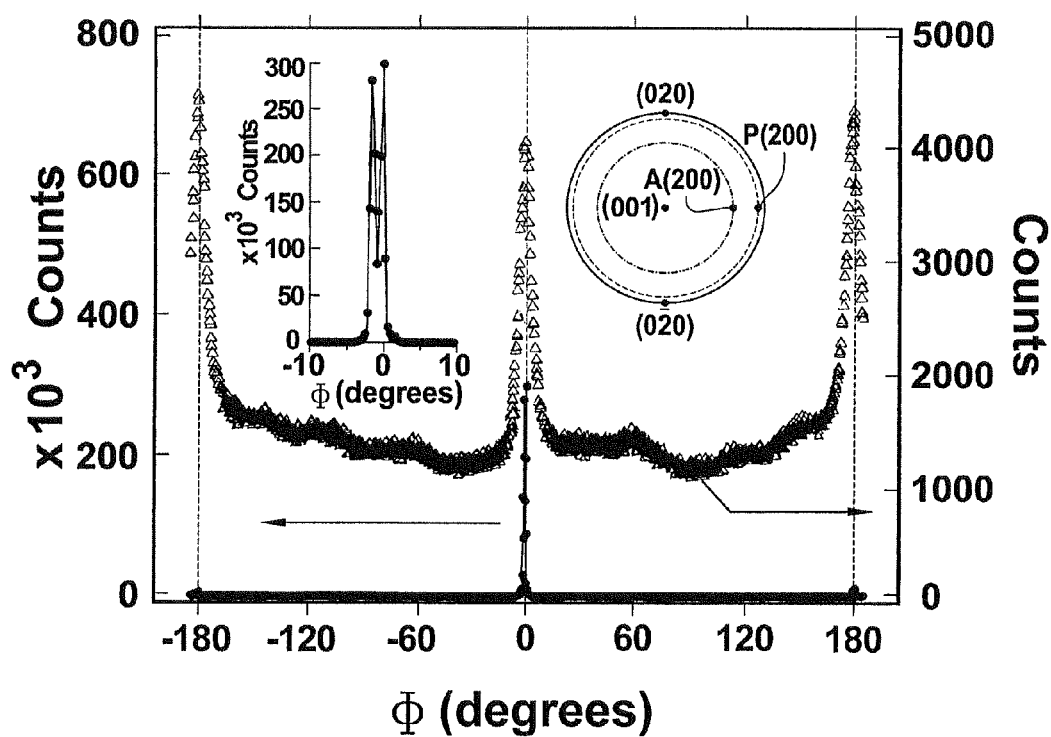
FIG. 8 is a composite of a plot of an x-ray diffraction scan for the (200) reflection of the Pentacene deposited relative to FIG. 7, a plot, and an enlarged plot, of an azimuthal x-ray diffraction scan on the (200) reflection of the Antracene film onto which Pentacene was deposited, and a stereographic projection.

Grazing incidence x-ray diffraction scans were performed on additional Anthracene films and Anthracene films with Pentacene overlayers, in order to establish the in-plane orientation of both layers. A sample prepared in the same manner as the sample of FIG. 5, with a 40 nm thick Pentacene overlayer exhibited a planar, oriented dendritic surface morphology and was found by polarization microscopy to be predominantly (>95%) single crystal in nature. FIG. 8 shows an azimuthal scan on the (200) reflection of Anthracene (filled circles) for this sample. If the film were polycrystalline, composed of domains with a perfectly random distribution of azimuthal orientations, a continuous low intensity would be observed. Since we observe one dominant reflection at 0°, the film is predominantly single-crystal. However, the left-hand inset shows evidence for two grains with about a 1° mis-orientation relative to each other.

In order to assist the reader in interpreting the orientations of the Anthracene and Pentacene crystal planes in the aligned samples, a stereographic projection is included as the right-hand inset of FIG. 8. The polar angle between the (001) reflection and the (200) reflection is $\beta^*=100-\beta$ where $\beta$ is the real-space angle between the a and c lattice vectors of the thin-film crystal structure and $\beta^*$ is the corresponding polar angle in the stereographic projection. The Anthracene (200) is observed at $\beta^*=55.4°$, consistent with the structure of Anthracene. The path of the scan corresponding to the Anthracene (200) data shown in FIG. 8 is indicated in the right-hand inset by the red dashed line.

Figure 3:
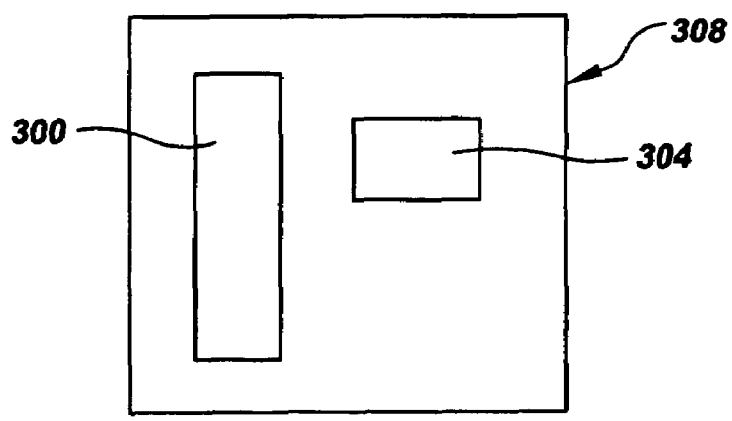
FIG. 3 is a high-level block diagram of an electronic device comprising a plurality of organic microelectronic elements made in accordance with the present invention.

An additional piece of information about the Anthracene film can be obtained from FIG. 8: The sample has been oriented so that the scattering vector is perpendicular to the film growth direction at the azimuthal angle $\phi$=0. Therefore, since the (200) reflection appears at $\phi$=0, we conclude that the [200] direction is perpendicular to the Anthracene growth direction. In other words the domains shown in FIGS. 2 and 3 are oriented with their long axes parallel to the [010] crystallographic direction.

The data of FIG. 8 confirm that the individual planar dendrites in FIG. 5 have identical crystallographic orientations. Apparently, a combination of the preferred orientation imposed by the deposition process, and the links between adjacent branches in the structure is enough to select a single crystallographic orientation for the whole area. The origin of this two-dimensional dendrite structure is not presently understood, but it appears to be related to well-known growth instabilities, such as the Mullins-Sekerka instability, which may be induced by concentration gradients as molecules diffuse in the region of the meniscus and are depleted by being incorporated into the film.

FIG. 8 also shows a scan for the (200) reflection of Pentacene on the same sample (triangular data points), which exhibits strong reflections with a continuous low intensity in-between the reflections. The Pentacene (200) reflection is completely separated from the Anthracene (200) reflection because of different tilt of molecules, and hence of the unit cell. As a result of this difference, the Pentacene (200) is observed at $\beta^*=85°$, which directly gives $\beta=95°$ for the thin film phase of Pentacene. The path of the scan corresponding to the Pentacene (200) data is indicated in the inset by the blue dashed line. The background level for the Pentacene scan is about 1000 counts, so the fact that the intensity between the reflections is higher than 1000 indicates that there are some mis-oriented grains. Since the sample has a discontinuous structure with regions of the substrate visible (FIG. 5), it is reasonable that some fraction of the Pentacene film grows in a polycrystalline mode, hence the presence of the observed continuous ring in reciprocal space. The dominant aligned peaks are correlated with the growth direction of the Anthracene base layer, and also with the Anthracene crystallographic orientation. The reflection at $\phi=\pm 180°$ is attributed to a crystal orientation with the [200] direction pointing in the opposite direction. Based on this information, we find that the preferred Anthracene/Pentacene epitaxial relationship is $(001)_a\|(001)_p$ and $[100]_a\|[100]_p$.

We have not observed strain effects on Pentacene layers. Rather, all of the observed reflections, including (001), (200), (020), and (110) appear to be at their unstrained positions. This may be interpreted as evidence of incommensurate epitaxy. On the other hand, the ratios of the Anthracene and Pentacene lattice parameters fall very close to the rational fractions 9/8 (within 0.3%) and 51/50 (within 0.1%). When the ratios are rational numbers, the growth is classified as "coincident epitaxy", where every $n^{th}$ site of the substrate lattice is coincident with every $m^{th}$ site of the overlayer's lattice, and n and m are integers. This may help to explain the high degree of azimuthal orientation observed for Pentacene growth on Anthracene, since the coincidence effect would reduce the interface energy between the layers relative to random orientations. There is also a possibility of strain effects during the initial stages of nucleation and growth of the Pentacene films that have relaxed by the time the film reaches its final thickness. If the film were fully coherent during the initial stages of nucleation, then the orientation would be determined at that time. Another effect that can cause oriented epitaxy is orientation by surface features such as step-edges or facets. Presently, it is not known which of these effects is the dominant one.

Implementation of a CTSD method of the present invention has demonstrated successful growth of thin structures with macroscopic single-crystal domain sizes. The present invention is very general, and may be extended to the growth of materials other than Anthracene. It has also been demonstrated that a Pentacene layer can be grown as a highly oriented film on top of an Anthracene thin structure grown in accordance with the present invention. The Pentacene overlayer can maintain the crystallographic orientation of the Anthracene layer. The observed high-degree of ordering is generally surprising, since there is a significant degree of lattice mismatch between the two materials, and the interface interaction between the two materials is very weak.

Although the invention has been described and illustrated with respect to an exemplary embodiment thereof, it should be understood by those skilled in the art that the foregoing and various other changes, omissions and additions may be made therein and thereto, without parting from the spirit and scope of the present invention.

What is claimed is:

1. A method of growing a crystalline film of a semiconductor material, comprising:
   providing a substrate that includes a growth region on which the crystalline film will be formed;
   providing a vessel containing a solution of dissolved molecules of the semiconductor material, the solution having a free surface;
   submerging the entirety of the growth region in the solution so that a meniscus forms between said free surface and the growth region;
   establishing an initial lateral seed front on the growth region; and
   moving the meniscus relative to the growth region by mechanical means or by evaporation of solution from the vessel so as to substantially continuously free the substrate from the solution and substantially continuously grow the crystalline film on the growth region therealong by first adding ones of the dissolved molecules to the initial lateral seed front to create a lateral growth front and then continually adding more of the dissolved molecules to the lateral growth front.

2. The method of claim 1, wherein said providing of the substrate includes providing a substrate in which the growth region is polycrystalline.

3. The method of claim 1, wherein said providing of the substrate includes providing a substrate in which the growth region is non-crystalline.

4. A method according to claim 1, wherein said moving of the meniscus comprises moving the free surface by removing a portion of the solution from the vessel.

5. A method according to claim 1, wherein the vessel has a volume and said moving of the meniscus comprises moving the free surface by changing the volume of the vessel.

6. A method according to claim 5, wherein said moving of the meniscus includes removing some of said solution from the vessel.

7. A method according to claim 1, wherein said providing of the solution of dissolved molecules comprises providing a solution containing dissolved molecules of an organic semiconductor material.

8. A method according to claim 7, wherein said providing of the solution containing dissolved molecules comprises providing a solution containing dissolved Anthracene molecules.

9. A method according to claim 7, wherein said providing of the solution containing dissolved molecules comprises providing a solution containing dissolved Tetracene molecules.

10. A method according to claim 1, wherein step b) comprises adding molecules so as to grow a crystalline dendritic structure.

11. A method according to claim 1, wherein the crystalline film has a thickness in a direction perpendicular to the growth region and said moving of the meniscus so as to substantially continuously grow the crystalline film comprises adding molecules so that the thickness is less than 5 µm.

12. A method according to claim 1, wherein the crystalline film has a grain size in a direction parallel to said surface and said moving of the meniscus so as to substantially continuously grow the crystalline film comprises adding molecules so that the grain size is greater than 0.7 cm×0.7 cm.

13. A method according to claim 1, wherein said surface has a surface wetting property and the method further comprising, prior to step b), the step of modifying said surface wetting property so as to improve wetting.

* * * * *